United States Patent
Park et al.

(10) Patent No.: US 9,293,738 B2
(45) Date of Patent: Mar. 22, 2016

(54) ORGANIC LIGHT-EMITTING DISPLAY AND METHOD OF MANUFACTURING THE SAME

(71) Applicant: Samsung Display Co. Ltd., Yongin, Gyeonggi-Do (KR)

(72) Inventors: Sun Park, Suwon-si (KR); Jeong Hwan Kim, Hwaseong-si (KR); Deok Young Choi, Hwaseong-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/447,151

(22) Filed: Jul. 30, 2014

(65) Prior Publication Data
US 2015/0263308 A1 Sep. 17, 2015

(30) Foreign Application Priority Data

Mar. 17, 2014 (KR) ........................ 10-2014-0031013

(51) Int. Cl.
*H01L 51/52* (2006.01)
*H01L 51/54* (2006.01)
*H01L 51/56* (2006.01)
*H01L 27/32* (2006.01)

(52) U.S. Cl.
CPC .......... *H01L 51/529* (2013.01); *H01L 27/3244* (2013.01); *H01L 51/5212* (2013.01); *H01L 51/5228* (2013.01); *H01L 51/5237* (2013.01); *H01L 51/56* (2013.01); *H01L 2227/323* (2013.01)

(58) Field of Classification Search
CPC ............ H01L 27/3276; H01L 27/3279; H01L 27/3288; H01L 27/329; H01L 27/3297; H01L 51/52; H01L 51/5203; H01L 51/56; H01L 2251/56; H01L 2221/10; H01L 23/5286; H01L 23/50; H01L 2027/11881
USPC .................................................. 313/498–512
See application file for complete search history.

(56) References Cited

U.S. PATENT DOCUMENTS

| 7,402,945 | B2* | 7/2008 | Yamazaki et al. ............ 313/504 |
| 7,446,336 | B2* | 11/2008 | Yamazaki et al. ............. 257/59 |
| 2003/0137325 | A1* | 7/2003 | Yamazaki et al. ............. 327/80 |
| 2003/0183830 | A1* | 10/2003 | Yamazaki et al. ............. 257/90 |

(Continued)

FOREIGN PATENT DOCUMENTS

| KR | 1020060000849 A | 1/2006 |
| KR | 1020070010014 A | 1/2007 |
| KR | 1020080016129 A | 2/2008 |
| KR | 1020090046643 A | 5/2009 |
| KR | 1020090132359 A | 12/2009 |

(Continued)

*Primary Examiner* — Anne Hines
*Assistant Examiner* — Jose M Diaz
(74) *Attorney, Agent, or Firm* — Robert E. Bushnell, Esq.

(57) ABSTRACT

Provided are an organic light-emitting display (OLED) and a method of manufacturing the same. According to an aspect of the present invention, there is provided an OLED comprising a substrate which comprises a display area and a non-display area adjacent to the display area, an organic light-emitting device which is located on the display area of the substrate and comprises a first electrode, an organic light-emitting layer and a second electrode stacked sequentially, a power supply plate which is located on the non-display area of the substrate, and an extension electrode which is located on the non-display area of the substrate and extends from the second electrode to be connected to the power supply plate, wherein at least one recess pattern is formed on the power supply plate, and the extension electrode covers the recess pattern.

19 Claims, 13 Drawing Sheets

(56) References Cited

U.S. PATENT DOCUMENTS

| | | | |
|---|---|---|---|
| 2003/0193056 A1* | 10/2003 | Takayama et al. | 257/79 |
| 2006/0125390 A1* | 6/2006 | Oh | 313/506 |
| 2007/0024181 A1* | 2/2007 | Oh | 313/500 |
| 2008/0036387 A1* | 2/2008 | Jung et al. | 315/169.3 |
| 2009/0128023 A1* | 5/2009 | Kwak et al. | 313/504 |
| 2009/0302746 A1 | 12/2009 | Lim et al. | |

FOREIGN PATENT DOCUMENTS

| | | |
|---|---|---|
| KR | 1020110019498 A | 2/2011 |
| KR | 1020110035049 A | 4/2011 |
| KR | 1020110111746 A | 10/2011 |
| KR | 1020110111747 A | 10/2011 |
| KR | 1020120103970 A | 9/2012 |
| KR | 1020130025806 A | 3/2013 |

* cited by examiner

ORGANIC LIGHT-EMITTING DISPLAY AND METHOD OF MANUFACTURING THE SAME

CLAIM OF PRIORITY

This application claims priority from Korean Patent Application No. 10-2014-0031013 filed on Mar. 17, 2014 in the Korean Intellectual Property Office, the disclosure of which is incorporated herein by reference in its entirety.

BACKGROUND OF THE INVENTION

1. Field of the Invention

The present invention generally relates to an organic light-emitting display (OLED) and a method of manufacturing the same, and more particularly, to an organic light-emitting display (OLED) having a recess pattern and a method of manufacturing the same.

2. Description of the Related Art

An organic light-emitting display (OLED) is a display device that can display information such as images, text, etc. by using light generated when holes and electrons supplied respectively from an anode and a cathode combine in an organic layer interposed between the anode and the cathode.

The organic layer of the OLED is made of an organic material susceptible to moisture. Therefore, the organic layer should be protected from external moisture. In addition, a region in which power supply wiring connected to an external power source is connected to an extension electrode extending from the cathode generates a lot of heat. If the connection region of the power supply wiring to the extension electrode generates heat above a certain level, devices around the connection region are likely to be degraded. Therefore, it is required to control heat generated from the connection region of the power supply wiring to the extension electrode below the certain level.

SUMMARY OF THE INVENTION

Aspects of the present invention provide an organic light-emitting display (OLED) which can protect organic light-emitting devices, thin-film transistors (TFTs), etc. from external moisture and control heat generated from a panel below a certain level.

Aspects of the present invention also provide a method of manufacturing an OLED which can protect organic light-emitting devices, TFTs, etc. from external moisture and control heat generated from a panel below a certain level.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided an organic light-emitting display (OLED) comprising a substrate which comprises a display area and a non-display area adjacent to the display area, an organic light-emitting device which is located on the display area of the substrate and comprises a first electrode, an organic light-emitting layer and a second electrode stacked sequentially, a power supply plate which is located on the non-display area of the substrate, and an extension electrode which is located on the non-display area of the substrate and extends from the second electrode to be connected to the power supply plate, wherein at least one recess pattern is formed on the power supply plate, and the extension electrode covers the recess pattern.

The extension electrode may be made of the same material as the second electrode.

The recess pattern may be linear.

The recess pattern may surround the display area.

The non-display area may comprise contact regions in which the power supply plate and the extension electrode are connected to each other, wherein the contact regions may comprise a first contact region which is located on a side of the recess pattern and a second contact region which is located on the other side of the recess pattern.

The sum of the areas of the contact regions may be greater than the area of the power supply plate.

The OLED may further comprise a thin-film transistor (TFT) which is located on the display area of the substrate, wherein the TFT comprises a semiconductor pattern which is located on the substrate, a gate electrode which is located on the semiconductor pattern, and a source electrode which is located on a side of the gate electrode and connected to a side of the semiconductor pattern, and a drain electrode which is located on the other side of the gate electrode and connected to the other side of the semiconductor pattern, wherein the drain electrode may be connected to the first electrode, and the power supply plate is made of the same material as the gate electrode.

The OLED may further comprise lower connection electrodes which are interposed between the power supply plate and the extension electrode and connected to the power supply plate, wherein the lower connection electrodes may comprise a first lower connection electrode which is located on a side of the recess pattern and a second lower connection electrode which is located on the other side of the recess pattern.

The recess pattern may be formed between the first lower connection electrode and the second lower connection electrode.

The lower connection electrodes may be made of the same material as the source electrode and the drain electrode.

The OLED may further comprise upper connection electrodes which are interposed between the lower connection electrodes and the extension electrode and connected to the lower connection electrodes and the extension electrode, wherein the upper connection electrodes may comprise a first upper connection electrode which is interposed between the first lower connection electrode and the extension electrode and a second upper connection electrode which is interposed between the second lower connection electrode and the extension electrode.

The upper connection electrodes may be made of the same material as the first electrode.

Side surfaces of the lower connection electrodes and side surfaces of the upper connection electrodes may be covered with an insulating layer.

According to another aspect of the present invention, there is provided an OLED comprising a substrate which comprises a display area and a non-display area adjacent to the display area, an organic light-emitting device which is located on the display area of the substrate, a power supply plate which is located on the non-display area of the substrate, a first lower connection electrode and a second lower connection electrode which are located on both sides of the power supply plate, respectively, a first upper connection electrode and a second upper connection electrode which are located on the first lower connection electrode and the second lower connection electrode, respectively, and an extension electrode which is located on the first upper connection electrode and the second upper connection electrode and extends to the display area to be connected to the organic light-emitting device.

A recess pattern may be formed at a boundary between both sides of the power supply plate, and the extension electrode covers the recess pattern.

The organic light-emitting device may comprise a first electrode, an organic light-emitting layer, and a second electrode stacked sequentially, and the extension electrode is connected to the second electrode.

According to still another aspect of the present invention, there is provided a method of manufacturing an OLED, the method comprising forming a power supply plate on a non-display area of a substrate, forming a first lower connection electrode and a second lower connection electrode on both sides of the power supply plate, respectively, forming a first upper connection electrode and a second upper connection electrode on the first lower connection electrode and the second lower connection electrode, respectively, and forming an extension electrode, which extends to a display area of the substrate, on the first upper connection electrode and the second upper connection electrode.

The extension electrode may cover a recess pattern formed at a boundary between both sides of the power supply plate.

The method of manufacturing an OLED may further comprise forming a TFT, which comprises a gate electrode, a source electrode and a drain electrode, on the display area of the substrate before the forming of the first upper connection electrode and the second upper connection electrode, wherein the power supply plate may be formed at the same time as the gate electrode, and the first lower connection electrode and the second lower connection electrode may be formed at the same time as the source electrode and the drain electrode.

The method of manufacturing an OLED may further comprise sequentially stacking a first electrode, an organic light-emitting layer, and a second electrode on the display area of the substrate after the forming of the first lower connection electrode and the second lower connection electrode, wherein the first upper connection electrode and the second upper connection electrode may be formed at the same time as the first electrode, and the extension electrode may be formed at the same time as the second electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
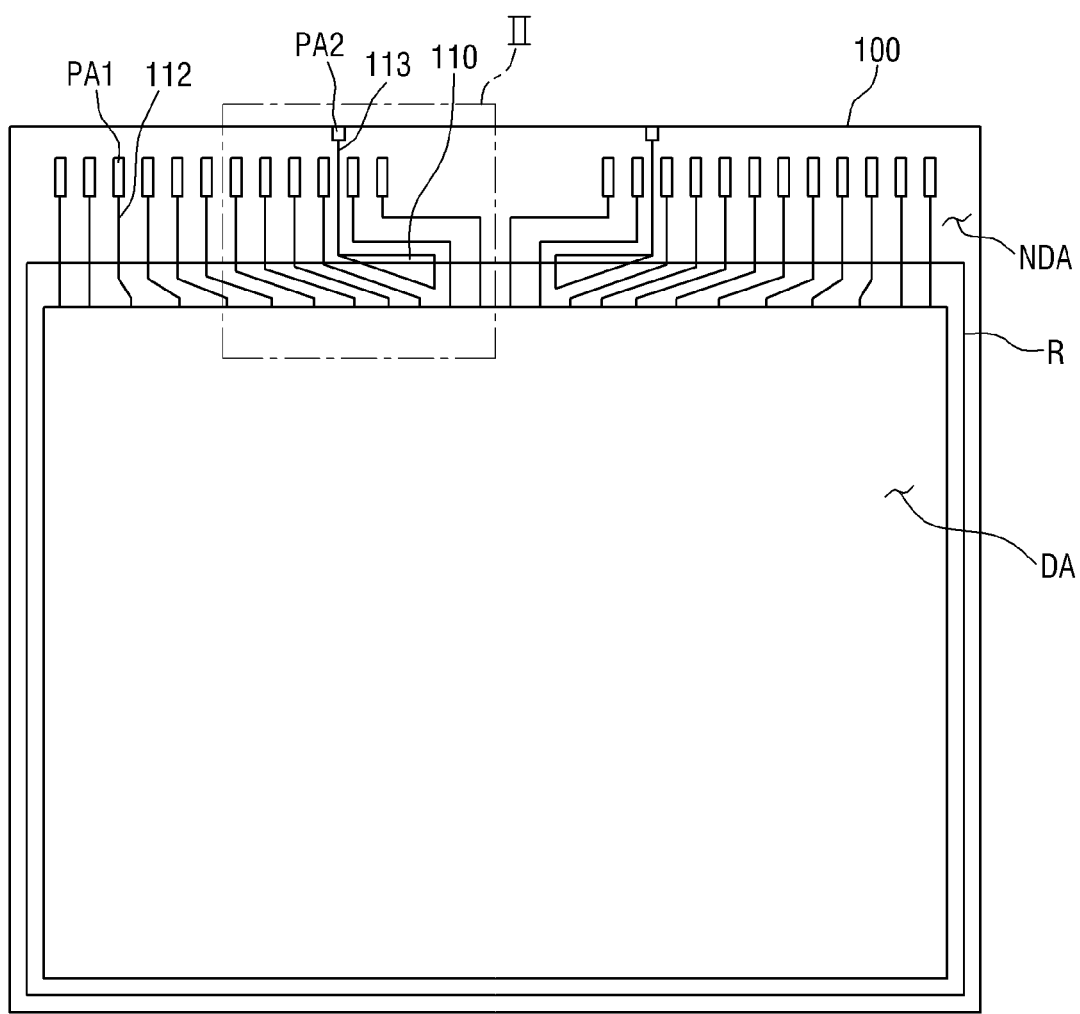
FIG. 1 is a plan view of an organic light-emitting display (OLED) according to an embodiment of the present invention.

The aspects and features of the present invention and methods for achieving the aspects and features will be apparent by referring to the embodiments to be described in detail with reference to the accompanying drawings. However, the present invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the present invention is only defined within the scope of the appended claims.

The term "on" that is used to designate that an element is on another element or located on a different layer or a layer includes both a case where an element is located directly on another element or a layer and a case where an element is located on another element via another layer or still another element. In the entire description of the present invention, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

The present invention will now be described more fully with reference to the accompanying drawings, in which exemplary embodiments of the invention are shown.

Figure 2:
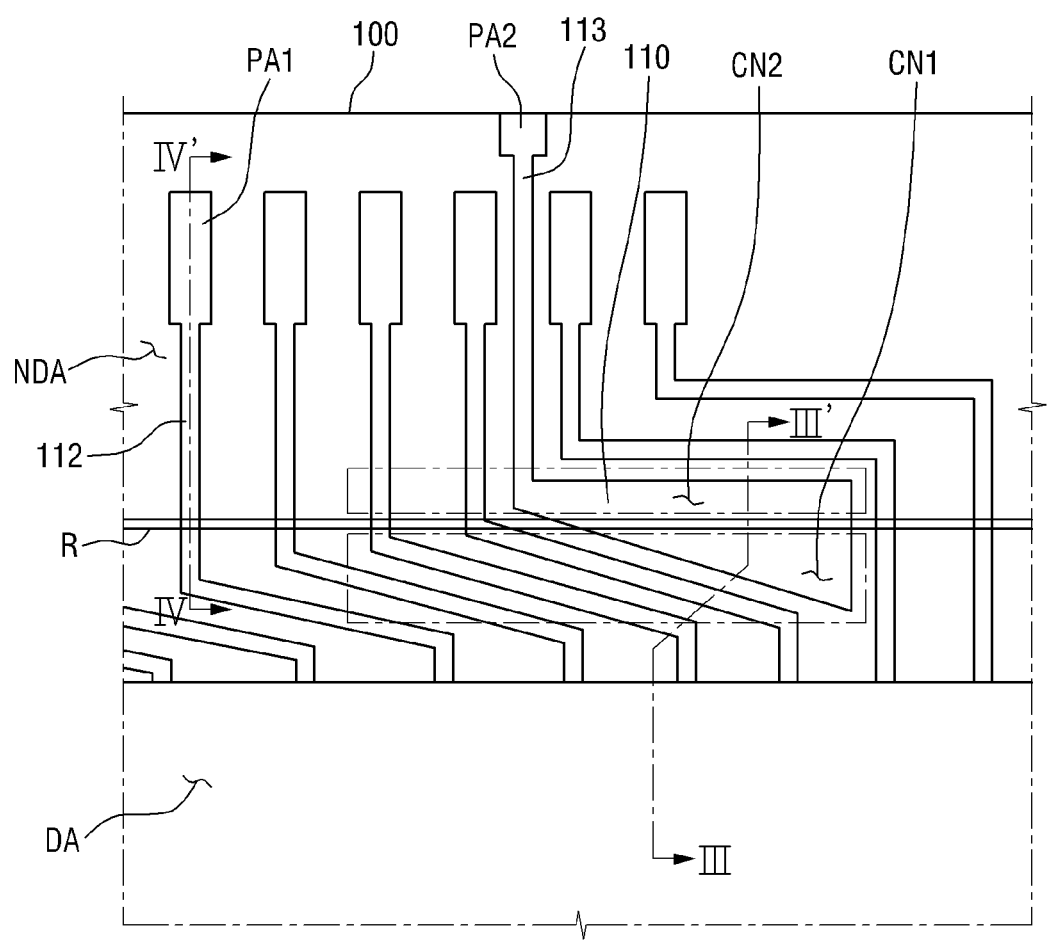
FIG. 2 is an enlarged plan view of a portion II of FIG. 1.
Figure 3:
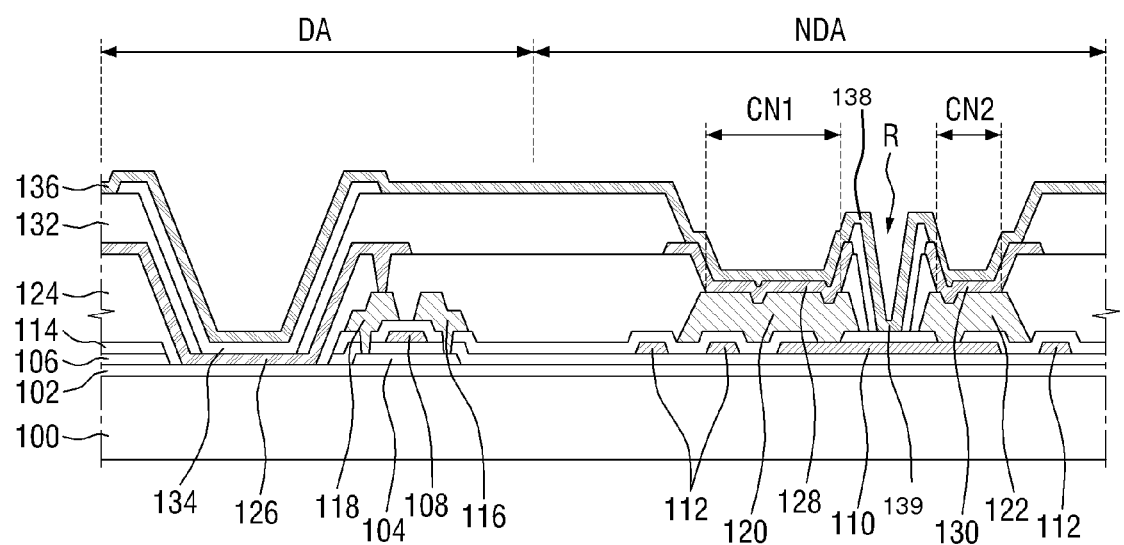
FIG. 3 is a cross-sectional view taken along the line III-III' of FIG. 2.
Figure 4:
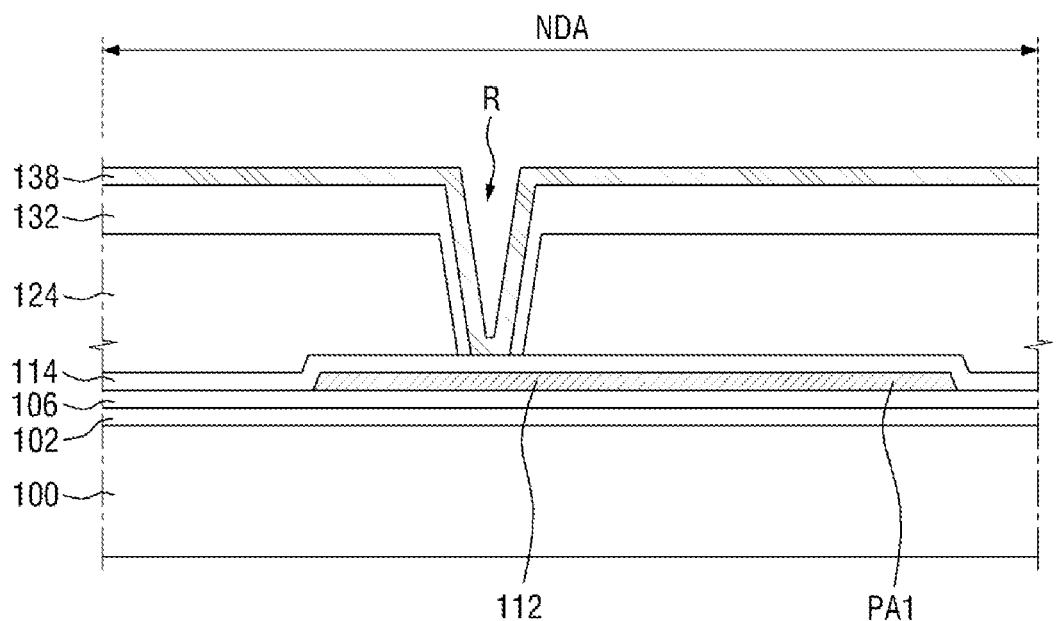
FIG. 4 is a cross-sectional view taken along the line IV-IV' of FIG. 2.

FIG. 1 is a plan view of an organic light-emitting display (OLED) according to an embodiment of the present invention. FIG. 2 is an enlarged plan view of a portion II of FIG. 1. FIG. 3 is a cross-sectional view taken along the line III-III' of FIG. 2. FIG. 4 is a cross-sectional view taken along the line IV-IV' of FIG. 2.

Referring to FIGS. 1 through 4, the OLED according to the current embodiment may include a substrate 100, a buffer layer 102, a semiconductor pattern 104, a gate insulating layer 106, a gate electrode 108, a power supply plate 110, a first pad PA1, a first wiring layer 112, a second pad PA2, a second wiring layer 113, an interlayer insulating film 114, a source electrode 116, a drain electrode 118, lower connection electrodes 120 and 122, a via layer 124, a first electrode 126, upper connection electrodes 128 and 130, a pixel defining layer 132, an organic light-emitting layer 134, a second electrode 136, and an extension electrode 138.

In the present specification, an "OLED" will be described as an example. However, the present invention is not limited to the OLED. That is, a liquid crystal display (LCD), an electrophoretic display, a field emission display (FED), a surface-conduction electron-emitter display (SED), a plasma display, a cathode ray tube display, etc. can also be used.

The substrate 100 may be shaped like a rectangular parallelepiped plate. A surface of the substrate 100 may be flat, and various structures that constitute the display device may be formed on the flat surface.

The substrate 100 may be a transparent insulating substrate. For example, the substrate 100 may be a glass substrate, a quartz substrate, a transparent resin substrate, etc. In addition, the substrate 100 may include a polymer with high thermal resistance. In an example, the substrate 100 may include any one material selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate, cellulose acetate propionate (CAP), poly(aryleneether sulfone), and various combinations thereof.

The substrate 100 may have flexibility. That is, the substrate 100 may be a deformable substrate that can be rolled, folded, bent, etc.

The substrate 100 may include a display area DA and a non-display area NDA.

The display area DA may be an area where various devices for actually driving the OLED, such as organic light-emitting devices and thin-film transistors (TFTs), are located. In addition, the display area DA may be an area where images are displayed. The display area DA may be located in the middle of the substrate 100.

The non-display area NDA may be adjacent to the display area DA. In addition, the non-display area NDA may surround the display area DA. The non-display area NDA may be adjacent to edges of the substrate 100. That is, the non-display area NDA may be located in an edge portion of the substrate 100. In an exemplary embodiment, the non-display area NDA may be shaped like a quadrangular or circular donut that surrounds all around the display area DA.

The non-display area NDA may include contact regions CN1 and CN2 where the power supply plate 110, to which external power is supplied, is connected to one electrode of each organic light-emitting device. The contact regions CN1 and CN2 will be described in greater detail later.

The buffer layer 102 may be disposed on the substrate 100. The buffer layer 102 may be located on the display area DA and the non-display area NDA of the substrate 100. The buffer layer 102 may prevent the diffusion of metallic atoms, impurities, etc. from the substrate 100. If the surface of the substrate 100 is not even, the buffer layer 102 may improve the flatness of the surface of the substrate 100.

The buffer layer 102 may be made of a silicon compound such as silicon oxide, silicon nitride, silicon oxynitride, silicon oxycarbide, silicon carbonitride, etc. These materials may be used alone or in combination. In other exemplary embodiments, the buffer layer 102 may have a single layer structure or a multilayer structure including a silicon compound. For example, the buffer layer 102 may include a silicon oxide layer, a silicon nitride layer, a silicon oxynitride layer, a silicon oxycarbide layer, and/or a silicon carbonitride layer. The buffer layer 102 can be omitted, depending on the surface flatness, material, etc. of the substrate 100.

The semiconductor pattern 104 may be formed on the buffer layer 102. Specifically, the semiconductor pattern 104 may be located on the display area DA of the substrate 100. The semiconductor pattern 104 may be made of amorphous semiconductor, microcrystalline semiconductor, or polycrystalline semiconductor. Preferably, the semiconductor pattern 104 may be made of polycrystalline semiconductor. The semiconductor pattern 104 may also be made of oxide semiconductor. The semiconductor pattern 104 may include a channel portion undoped with impurities and p+-doped source and drain portions which are disposed on opposite sides of the channel portion. Here, an ion material used to dope the source and drain portions may be P-type impurities such as boron (B). For example, B2H6 may be used. The impurities may vary according to the type of a TFT.

The gate insulating layer 106 may be formed on the buffer layer 102 to cover the semiconductor pattern 104. The gate insulating layer 106 may be located on the display area DA and the non-display area NDA of the substrate 100. The gate insulating layer 106 may be made of silicon oxide (SiOx), silicon nitride (SiNx), or metal oxide. Examples of the metal oxide that can be used in the gate insulating layer 106 may include hafnium oxide (HfOx), aluminum oxide (AlOx), zirconium oxide (ZrOx), titanium oxide (TiOx), and tantalum oxide (TaOx). These materials may be used alone or in combination. The gate insulating layer 106 may be formed on the buffer layer 102 to a substantially uniform thickness along a profile of the semiconductor pattern 104. The gate insulating layer 106 may be relatively thin and may have a step portion formed adjacent to the semiconductor pattern 104. In other exemplary embodiments, the gate insulating layer 106 may have a substantially flat top surface while fully covering the semiconductor pattern 104. In this case, the gate insulating layer 106 may be relatively thick.

The gate electrode 108 may be formed on the gate insulating layer 106. The gate electrode 108 may be located on the display area DA of the substrate 100. The gate electrode 108 may be formed on a portion of the gate insulating layer 106 under which the semiconductor pattern 104 is located. The gate electrode 108 may include a metal, an alloy, metal nitride, conductive metal oxide, a transparent conductive material, etc. In an example, the gate electrode 108 may include aluminum (Al), an aluminum-containing alloy, aluminum nitride (AlNx), silver (Ag), a silver-containing alloy, tungsten (W), tungsten nitride (WNx), copper (Cu), a copper-containing alloy, nickel (Ni), chrome (Cr), chrome nitride (CrOx), molybdenum (Mo), a molybdenum-containing alloy, titanium (Ti), titanium nitride (TiNx), platinum (Pt), tantalum (Ta), tantalum nitride (TaNx), neodymium (Nd), scandium (Sc), strontium ruthenium oxide (SrRuxOy), zinc oxide (ZnOx), indium tin oxide (ITO), tin oxide (SnOx), indium oxide (InOx), gallium oxide (GaOx), indium zinc oxide (IZO), etc. These materials may be used alone or in combination. According to exemplary embodiments, the gate electrode 108 may have a single layer structure composed of the metal, the alloy, the metal nitride, the conductive metal oxide, or the transparent conductive material described above. Otherwise, the gate electrode 108 may have a multilayer structure composed of the metal, the alloy, the metal nitride, the conductive metal oxide, and/or the transparent conductive material. In exemplary embodiments, the gate electrode 108 may be substantially narrower than the semiconductor pattern 104. For example, a width of the gate electrode 108 may be substantially equal or similar to that of the channel portion. In addition, the gate electrode 108 and the channel portion may overlap each other. However, the dimensions of the gate electrode 108 and/or the dimensions of the channel portion may vary according to electrical characteristics required of a switching device including the gate electrode 108 and the channel portion.

The power supply plate 110 may be formed on the gate insulating layer 106. In addition, the power supply plate 110 may be located on the non-display area NDA of the substrate 100. The power supply plate 110 may supply power to the second electrode 136 of each organic light-emitting device. As illustrated in FIGS. 1 and 2, a planar shape of the power supply plate 110 may be triangular. The planar shape of the power supply plate 110 is triangular in order for optimum arrangement with the first wiring layer 112 which will be described later. However, the planar shape of the power supply plate 110 is not limited to the triangular shape. That is, the planar shape of the power supply plate 110 may also be quadrangular or circular.

The power supply plate 110 may include a metal, an alloy, metal nitride, conductive metal oxide, a transparent conductive material, etc. In addition, the power supply plate 110 may have a single layer structure. However, the structure of the power supply plate 110 is not limited to the single layer structure, and the power supply plate 110 may also have a multilayer structure. The power supply plate 110 may also be made of the same material as the gate electrode 108.

The first pad PA1 may be formed on the gate insulating layer 106. In addition, the first pad PA1 may be located on the non-display area NDA of the substrate 100. The first pad PA1 may be provided in a plurality, and the first pads PA1 may be arranged at regular intervals along an edge of the substrate 100. A printed circuit board (PCB) including a driver of the OLED may be attached to the first pads PA1, and the driver may transmit data signals, etc. to the first pads PA1.

Each of the first pads PA1 may include a metal, an alloy, metal nitride, conductive metal oxide, a transparent conductive material, etc. In addition, each of the first pads PA1 may have a single layer structure. However, the structure of each of the first pads PA1 is not limited to the single layer structure, and each of the first pads PA1 may also have a multilayer structure. The first pads PA1 may also be made of the same material as the gate electrode 108.

The first wiring layer 112 may be formed on the gate insulating layer 106. In addition, the first wiring layer 112 may be located on the non-display area NDA of the substrate 100. An end of the first wiring layer 112 may be connected to each of the first pads PA1, and the other end of the first wiring layer 112 may extend to the display area DA of the substrate 100. The first wiring layer 112 may receive a data signal from each of the first pads PA1 and deliver the received data signal to an organic light-emitting device located in the display area DA.

The first wiring layer 112 may be provided in a plurality. The first wiring layers 112 may be connected to the first pads PA1, respectively. The first wiring layers 112 may surround the power supply plate 110. In other words, the power supply plate 110 may be formed in a portion where the first wiring layers 112 are not located.

Each of the first wiring layers 112 may include a metal, an alloy, metal nitride, conductive metal oxide, a transparent conductive material, etc. In addition, each of the first wiring layers 112 may have a single layer structure. However, the structure of each of the first wiring layers 112 is not limited to the single layer structure, and each of the first wiring layers 112 may also have a multilayer structure. The first wiring layers 112 may also be made of the same material as the gate electrode 108.

The second pad PA2 may be formed on the gate insulating layer 106. In addition, the second pad PA2 may be located on the non-display area NDA of the substrate 100. The second pad PA2 may be provided in a plurality, and the second pads PA2 may be disposed adjacent to an edge of the substrate 100. The second pads PA2 may receive a power supply voltage from an external power source.

Each of the second pads PA2 may include a metal, an alloy, metal nitride, conductive metal oxide, a transparent conductive material, etc. In addition, each of the second pads PA2 may have a single layer structure. However, the structure of each of the second pads PA2 is not limited to the single layer structure, and each of the second pads PA2 may also have a multilayer structure. The second pads PA2 may also be made of the same material as the gate electrode 108.

The second wiring layer 113 may be formed on the gate insulating layer 106. In addition, the second wiring layer 113 may be located on the non-display area NDA of the substrate 100. An end of the second wiring layer 113 may be connected to each of the second pads PA2, and the other end of the second wiring layer 113 may be connected to the power supply plate 110. The second wiring layer 113 may receive a power supply voltage from each of the second pads PA2 and deliver the power supply voltage to the power supply plate 110.

The second wiring layer 113 may be provided in a plurality. The second wiring layers 113 may be connected to the second pads PA2, respectively. In an exemplary embodiment, each of the second wiring layers 113 may pass between two adjacent first pads PA1 and between two adjacent first wiring layers 112.

Each of the second wiring layers 113 may include a metal, an alloy, metal nitride, conductive metal oxide, a transparent conductive material, etc. In addition, each of the second wiring layers 113 may have a single layer structure. However, the structure of each of the second wiring layers 113 is not limited to the single layer structure, and each of the second wiring layers 113 may also have a multilayer structure. The second wiring layers 113 may also be made of the same material as the gate electrode 108.

The interlayer insulating film 114 may be formed on the gate electrode 108, the power supply plate 110, the first pads PA1, the first wiring layers 112, the second pads PA2, and the second wiring layers 113. In addition, the interlayer insulating film 114 may be located on the display area DA and the non-display area NDA of the substrate 100. The interlayer insulating film 114 may be made of an inorganic material. For example, the interlayer insulating film 114 may be made of a silicon compound such as silicon oxide, silicon nitride, silicon oxynitride, silicon carbonitride, silicon oxycarbide, etc. These materials may be used alone or in combination. In addition, the interlayer insulating film 114 may have a single layer structure or a multilayer structure including silicon oxide, silicon nitride, silicon oxynitride, silicon carbonitride, silicon oxycarbide, etc. Further, the interlayer insulating film 114 may be made of substantially the same material as the gate insulating layer 106.

Figure 7:
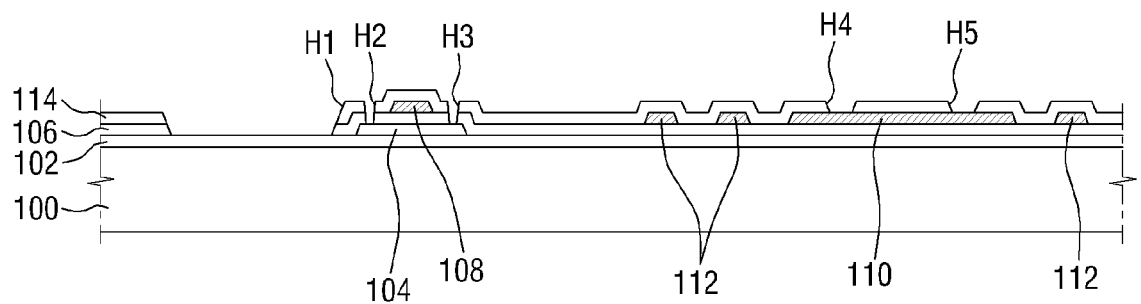

The gate insulating layer 106 and/or the interlayer insulating film 114 may include a plurality of holes H1 through H5 (see FIG. 7). Specifically, the gate insulating layer 106 and/or the interlayer insulating film 114 may include a hole H1 which is formed in a region adjacent to the semiconductor pattern 104 and the gate electrode 108, holes H2 and H3 which partially expose the semiconductor pattern 104, and holes H4 and H5 which partially expose the power supply plate 110. That is, the holes H1, H2, and H3 are formed in both the gate insulating layer 106 and the interlayer insulating film 114, and the holes H4 and H5 are formed only in the interlayer insulating film 114.

The source electrode 116 and the drain electrode 118 may be formed on the interlayer insulating film 114. Specifically, the source electrode 116 may be inserted into the hole H3, and the drain electrode 118 may be inserted into the hole H2. That is, the source electrode 116 and the drain electrode 118 may be formed on the display area DA of the substrate 100. The source electrode 116 and the drain electrode 118 may be separated by a predetermined distance with respect to the gate electrode 108 and may be disposed adjacent to the gate electrode 108. For example, the source electrode 116 and the drain electrode 118 may penetrate through the interlayer insulating film 114 and the gate insulating layer 106 so as to contact the source portion and the drain portion of the semiconductor pattern 104, respectively.

Each of the source electrode 116 and the drain electrode 118 may include a metal, an alloy, metal nitride, conductive metal oxide, a transparent conductive material, etc. In an example, each of the source electrode 116 and the drain electrode 118 may include aluminum, an aluminum-containing alloy, aluminum nitride, silver, a silver-containing alloy, tungsten, tungsten nitride, copper, a copper-containing alloy, nickel, chrome, chrome nitride, molybdenum, a molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These materials may be used alone or in combination. Each of the source electrode 116 and the drain electrode 118 may have a single layer structure or a multilayer structure composed of the metal, the alloy, the metal nitride, the conductive metal oxide, or the transparent conductive material described above.

The formation of the source electrode 116 and the drain electrode 118 on the interlayer insulating film 114 may produce a TFT, which includes the semiconductor pattern 104, the gate insulating layer 106, the gate electrode 108, the source electrode 116 and the drain electrode 118, on the substrate 100 as a switching device of the OLED. As described above, the TFT may be a top gate TFT. However, the present invention is not limited thereto, and the TFT may also be a bottom gate TFT.

The lower connection electrodes 120 and 122 may be formed on the interlayer insulating film 114. The lower connection electrodes 120 and 122 may penetrate through the interlayer insulating film 114 to be connected to the power supply plate 110. Specifically, the lower connection electrodes 120 and 122 may be inserted into the holes H4 and H5, respectively. That is, the lower connection electrodes 120 and 122 may be formed on the non-display area NDA of the substrate 100. In addition, the lower connection electrodes 120 and 122 may at least partially overlap at least one of the first wiring layers 112.

Each of the lower connection electrodes 120 and 122 may include a metal, an alloy, metal nitride, conductive metal oxide, a transparent conductive material, etc. In addition, each of the lower connection electrodes 120 and 122 may have a single layer structure. However, the structure of each of the lower connection electrodes 120 and 122 is not limited to the single layer structure, and each of the lower connection electrodes 120 and 122 may also have a multilayer structure. The lower connection electrodes 120 and 122 may also be made of the same material as the source electrode 116 and the drain electrode 118.

The lower connection electrodes 120 and 122 may include a first lower connection electrode 120 and a second lower connection electrode 122.

The first lower connection electrode 120 may be located on a side of the power supply plate 110. In an exemplary embodiment, the first lower connection electrode 120 may overlap a portion of the power supply plate 110 which is adjacent to the display area DA of the substrate 100. The first lower connection electrode 120 may be connected to the power supply plate 110 by filling into the hole H4 (see FIG. 7).

The second lower connection electrode 122 may be located on the other side of the power supply plate 110 which faces the above side of the power supply plate 110. In an exemplary embodiment, the second lower connection electrode 122 may overlap a portion of the power supply plate 110 which is adjacent to an edge of the substrate 100. The second lower connection electrode 122 may be connected to the power supply plate 110 by filling into the hole H5 (see FIG. 7).

A recess pattern R may be formed at a boundary between the first lower connection electrode 120 and the second lower connection electrode 122. The recess pattern R will be described in detail later.

The via layer 124 may be formed on the source electrode 116 and the drain electrode 118. The via layer 124 may cover edge portions of the lower connection electrodes 120 and 122. In addition, the via layer 124 may be formed on the display area DA and the non-display area NDA of the substrate 100.

The via layer 124 may have a flat surface. That is, the via layer 124 may be formed thick enough to have a flat surface on which pixels are located. The via layer 124 may be made of an insulating material. The via layer 124 may also be made of an organic material such as polyimide. The via layer 124 may have a single layer structure or a multilayer structure including two or more insulating layers.

Figure 9:
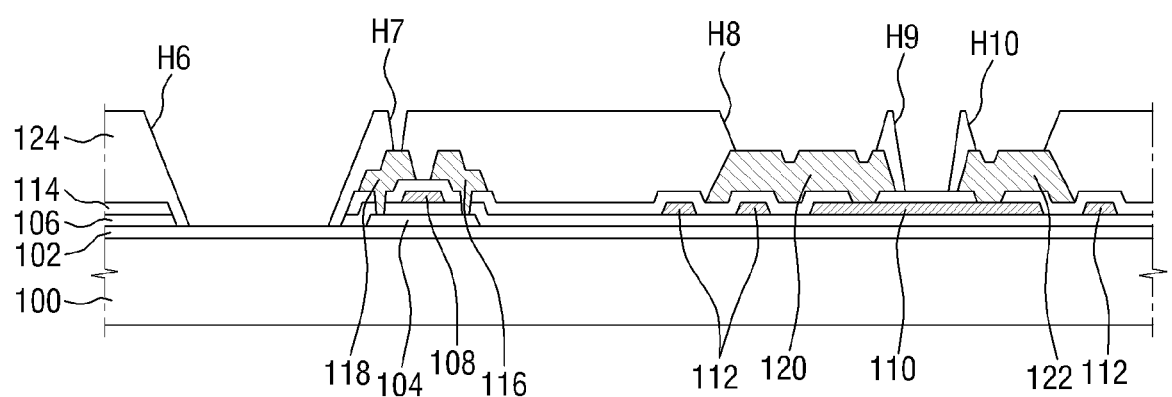

The via layer 124 may include a plurality of holes H6 through H10 (see FIG. 9). Specifically, the via layer 124 may include a hole H6 which is formed in a region adjacent to the semiconductor pattern 104 and the gate electrode 108 and overlaps the hole H1 (see FIG. 7), a hole H7 which partially exposes the drain electrode 118, a hole H8 which exposes a central portion of the first lower connection electrode 120, a hole H9 which exposes the boundary between the first lower connection electrode 120 and the second lower connection electrode 122, and a hole H10 which exposes a central portion of the second lower connection electrode 122.

The first electrode 126 may be located on the via layer 124. In addition, the first electrode 126 may be formed on the display area DA of the substrate 100. The first electrode 126 may be inserted into the hole H7 so as to be electrically connected to the drain electrode 118. The first electrode 126 may cover the hole H6. The first electrode 126 disposed adjacent to the substrate 100 can minimize the loss of light emitted in the direction of the substrate 100. That is, the OLED according to the current embodiment may have a bottom emission structure in which light is emitted in the direction of the substrate 100. However, the structure of the OLED is not limited to the bottom emission structure, and the OLED may also have a top emission structure in which light is emitted in a direction away from the substrate 100.

The first electrode 126 may be an anode or a cathode. If the first electrode 126 is an anode, the second electrode 136 may be a cathode. Thus, embodiments of the present invention will be described below based on this assumption. However, the first electrode 126 may also be a cathode, and the second electrode 136 may also be an anode.

To be used as an anode, the first electrode 126 may be made of a conductive material with a high work function. If the OLED is of a bottom emission type, the first electrode 126 may be made of a material such as ITO, IZO, ZnO or In2O3 or may be formed of a stacked layer of these materials. If the OLED is of a top emission type, the first electrode 126 may further include a reflective layer formed of Ag, Mg, Al, Pt, Pd, Au, Ni, Nd, Ir, Cr, Li or Ca. The first electrode 126 can be modified in various ways to have, for example, a structure composed of two or more layers formed using two or more different materials selected from the above materials.

The upper connection electrodes 128 and 130 may be formed on the lower connection electrodes 120 and 122. The upper connection electrodes 128 and 130 may directly contact the lower connection electrodes 120 and 122. Specifically, the upper connection electrodes 128 and 130 may be inserted into the holes H8 and H10, respectively. That is, the upper connection electrodes 128 and 130 may be formed on the non-display area NDA of the substrate 100. In addition, the upper connection electrodes 128 and 130 may at least partially overlap each of the first wiring layers 112.

Each of the upper connection electrodes 128 and 130 may include a metal, an alloy, metal nitride, conductive metal oxide, a transparent conductive material, etc. In addition, each of the upper connection electrodes 128 and 130 may have a single layer structure. However, the structure of each of the upper connection electrodes 128 and 130 is not limited to the single layer structure, and each of the upper connection electrodes 128 and 130 may also have a multilayer structure.

The upper connection electrodes 128 and 130 may also be made of the same material as the first electrode 126.

The upper connection electrodes 128 and 130 may include a first upper connection electrode 128 and a second upper connection electrode 130.

A central portion of the first upper connection electrode 128 may be located on the first lower connection electrode 120. In addition, edge portions of the first upper connection electrode 128 may be located on the via layer 124. The first upper connection electrode 128 may be located in the hole H8 and connected to the first lower connection electrode 120.

A central portion of the second upper connection electrode 130 may be located on the second lower connection electrode 122. In addition, edge portions of the second upper connection electrode 130 may be located on the via layer 124. The second upper connection electrode 130 may be located in the hole H10 and connected to the second lower connection electrode 122.

The recess pattern R may be formed at a boundary between the first upper connection electrode 128 and the second upper connection electrode 130. The recess pattern R will be described in detail later.

The pixel defining layer 132 may be formed on the first electrode 126. In addition, the pixel defining layer 132 may cover the edge portions of the upper connection electrodes 128 and 130. The pixel defining layer 132 may be formed on the display area DA and the non-display area NDA of the substrate 100. The pixel defining layer 132 may partially expose the first electrode 126.

The pixel defining layer 132 may be made of at least one organic material selected from benzocyclobutene (BCB), polyimide (PI), polyamaide (PA), acrylic resin and phenolic resin. The pixel defining layer 132 may also be made of a photosensitizer that contains a black pigment. In this case, the pixel defining layer 132 may serve as a light-blocking member.

Figure 11:
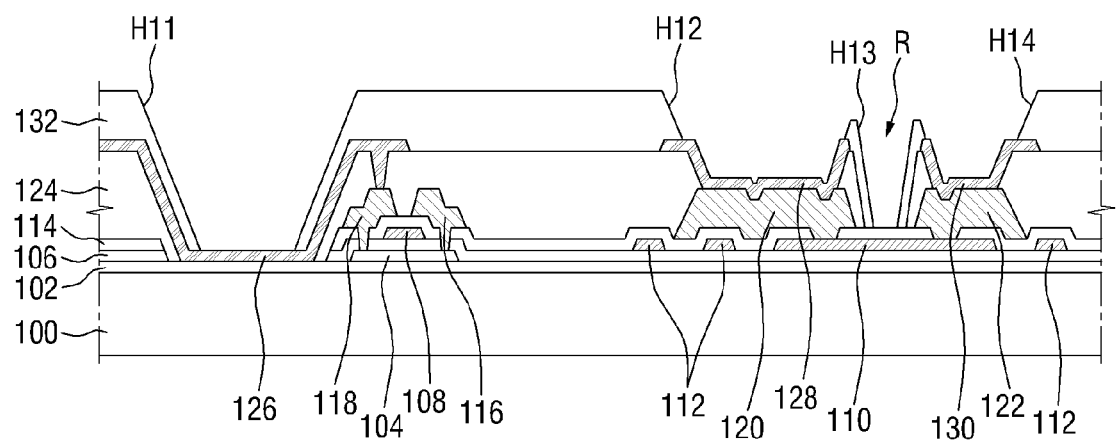

The pixel defining layer 132 may include a plurality of holes H11 through H14 (see FIG. 11). Specifically, the pixel defining layer 132 may include a hole H11 which is formed in a region adjacent to the semiconductor pattern 104 and the gate electrode 108 and overlaps the holes H1 and H6, a hole H12 which exposes the central portion of the first upper connection electrode 128, a hole H13 which exposes the boundary between the first upper connection electrode 128 and the second upper connection electrode 130 and overlaps the hole H9, and a hole H14 which exposes the central portion of the second upper connection electrode 130. The hole H11 exposes a portion of the first electrode 126.

The recess pattern R may be formed in the two holes H9 and H13 which overlap each other at the boundary between the first lower connection electrode 120 and the second lower connection electrode 122 and the boundary between the first upper connection electrode 128 and the second upper connection electrode 130. Specifically, the recess pattern R may be formed by the via layer 124 and the pixel defining layer 132 which cover side surfaces of the lower connection electrodes 120 and 122 and side surfaces of the upper connection electrodes 128 and 130 and the interlayer insulating film 114 which is disposed on the power supply plate 110.

The recess pattern R may separate the lower connection electrodes 120 and 122 and separate the upper connection electrodes 128 and 130. In the exemplary embodiment of FIGS. 1 and 2, the recess pattern R may be linear. The linear recess pattern R may not only be formed on the power supply plate 110 but also surround the display area DA of the substrate 100.

The organic light-emitting layer 134 is formed on the first electrode 126 exposed by the pixel defining layer 132. The organic light-emitting layer 134 may be formed on the display area DA of the substrate 100. In response to an electric current supplied to the organic light-emitting layer 134, electrons and holes within the organic light-emitting layer 134 may recombine to form excitons, and energy from the excitons may generate light of a certain wavelength.

The organic light-emitting layer 134 may be made of a small molecular weight organic material or a polymer organic material. The organic light-emitting layer 134 may include a hole-injection layer (HIL), a hole-transporting layer (HTL), a hole-blocking layer (HBL), an emitting layer (EML), an electron-transporting layer (ETL), an electron-injection layer (EIL), and an electron-blocking layer (EBL).

The second electrode 136 may be formed on the organic light-emitting layer 134 and the pixel defining layer 132. The second electrode 136 may be formed on the display area DA of the substrate 100. To be used as a cathode, the second electrode 136 may be made of a conductive material with a low work function. In an exemplary embodiment, the second electrode 136 may be formed of Ag, Mg, Al, Pt, Pd, Au, Ni, Nd, Ir, Cr, Li or Ca. The formation of the second electrode 136 on the organic light-emitting layer 134 may produce an organic light-emitting device, which includes the first electrode 126, the organic light-emitting layer 134 and the second electrode 136, on the substrate 100 as a display device of the OLED.

The extension electrode 138 may be formed on the upper connection electrodes 128 and 130 and the pixel defining layer 132. In addition, the extension electrode 138 may be formed on the non-display area NDA of the substrate 100. The extension electrode 138 may extend from the second electrode 136.

The extension electrode 138 may cover the recess pattern R. In an exemplary embodiment, the extension electrode 138 may be formed in the recess pattern R and separate the lower connection electrodes 120 and 122 and the upper connection electrodes 128 and 130. A cross-section of the extension electrode 138 located within the recess pattern R may have a substantially V or U shape. The interlayer insulating film 114 may be interposed between a portion 139 of the extension electrode 138, which corresponds to the valley of the recess pattern R, and the power supply plate 110. In another embodiment, forming the upper connection electrodes 128 and 130 at the non-display region NDA may be omitted. In this case, the extension electrode 138 may be directly formed on the lower connection electrodes 120 and 122.

The extension electrode 138 may include a metal, an alloy, metal nitride, conductive metal oxide, a transparent conductive material, etc. In addition, the extension electrode 138 may have a single layer structure. However, the structure of the extension electrode 138 is not limited to the single layer structure, and the extension electrode 138 may also have a multilayer structure. The extension electrode 138 may also be made of the same material as the second electrode 136.

In the non-display area NDA of the substrate 100, the power supply plate 110 to which external power is supplied may be connected to the second electrode 136 of each organic light-emitting device. Regions in which the power supply plate 110 and the second electrode 136 are connected by the lower connection electrodes 120 and 122 and the upper connection electrodes 128 and 130 may be referred to as the contact regions CN1 and CN2. The sum of the areas of the contact regions CN1 and CN2 may be greater than the area of the power supply plate 110.

The contact regions CN1 and CN2 may include a first contact region CN1 and a second contact region CN2.

The first contact region CN1 may be located on a side of the recess pattern R. In addition, the first contact region CN1 may be where the power supply plate 110 is connected to the extension electrode 138 by the first lower connection electrode 120 and the first upper connection electrode 128.

The second contact region CN2 may be located on the other side of the recess pattern R which faces the above side of the recess pattern R. In addition, the second contact region CN2 may be where the power supply plate 110 is connected to the extension electrode 138 by the second lower connection electrode 122 and the second upper connection electrode 130.

As described above, in the OLED according to the current embodiment, the recess pattern R may surround the display area DA of the substrate 100. Thus, the organic light-emitting devices, the TFTs, etc. within the display area DA can be protected from external moisture. Specifically, an organic insulating layer, i.e., the via layer 124 and the pixel defining layer 132 may serve as a passage of moisture. If external moisture is introduced into the organic insulating layer located in the edge portion of the substrate 100, it may be delivered to the organic light-emitting devices, the TFTs, etc. of the display area DA along the organic insulating layer. The moisture delivered to the display area DA may degrade characteristics of the organic light-emitting devices, the TFTs, etc. and directly adversely affect the display quality of the OLED. To prevent the occurrence of this phenomenon, the recess pattern R which interrupts the organic insulating layer may be placed to surround the display area DA of the substrate 100. In this case, since the passage of external moisture is blocked, devices within the display area DA can be stably protected from the external moisture.

Furthermore, since the contact regions CN1 and CN2 are separated by the recess pattern R, the heat generation of the OLED can be reduced. Specifically, connection portions (i.e., the contact regions CN1 and CN2) between the power supply plate 110 to which a constant voltage is continuously applied and the extension electrode 138 generate a lot of heat. However, since the contact regions CN1 and CN2 are separated by the recess pattern R, the generated heat can be dispersed. In particular, an increase in the width of the recess pattern R can increase the heat-dispersing effect.

The sum of the areas of the contact regions CN1 and CN2 may be set greater than the area of the power supply plate 110 so as to reduce the heat generation of the OLED. That is, the contact regions CN1 and CN2 may be increased by forming the lower connection electrodes 120 and 122 and the upper connection electrodes 128 and 130 wide enough to overlap the surrounding first wiring layers 112. In this case, not only can heat be dispersed but also areas from which heat is dissipated can increase. Consequently, the heat generation of the OLED can be reduced.

Also, the number of the contact regions CN1 and CN2 has increased from one to two. Therefore, when one of the contact regions CN1 and CN2 is defective, the defective contact region may be removed, and the power supply voltage may be applied to each organic light-emitting device using the other contact region. That is, even if one of the contact regions CN1 and CN2 is defective, the OLED may not be discarded. Instead, the OLED can still be used after being repaired.

Hereinafter, a method of manufacturing an OLED according to an embodiment of the present invention will be described with reference to FIGS. 5 through 12. FIGS. 5 through 12 are cross-sectional views illustrating steps of a method of manufacturing the OLED of FIG. 1. For simplicity, elements substantially identical to those of the above-described drawings are indicated by like reference numerals, and thus a redundant description thereof will be omitted.

Figure 5:
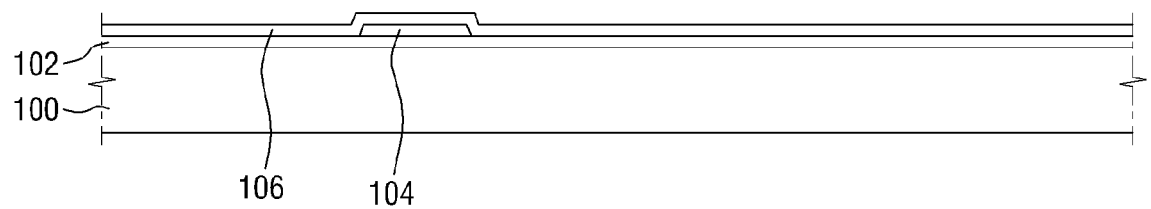
FIGS. 5 through 12 are cross-sectional views illustrating steps of a method of manufacturing the OLED of FIG. 1.

Referring to FIG. 5, a buffer layer 102, a semiconductor pattern 104, and a gate insulating layer 106 may be formed on a substrate 100.

Figure 6:
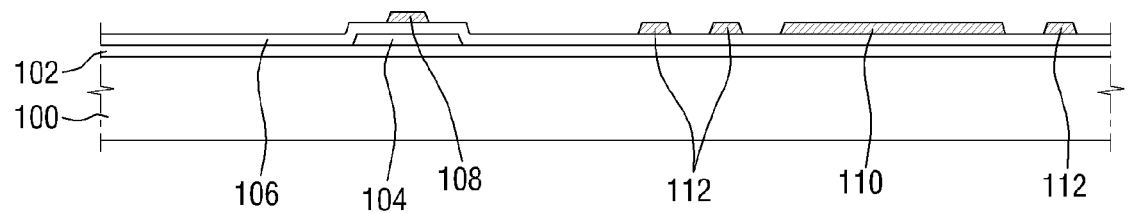

Referring to FIG. 6, a gate electrode 108, a power supply plate 110, and first wring layers 112 may be formed on the gate insulating layer 106. Here, the gate electrode 108, the power supply plate 110, and the first wiring layers 112 may be formed simultaneously.

Referring to FIG. 7, an interlayer insulating film 114 may be formed on the gate electrode 108, the power supply plate 110, and the first wiring layers 112. Here, the interlayer insulating film 114 may include a plurality of holes H1 through H5 described above. The holes H1 through H5 may be formed by a general photoresist process.

Figure 8:
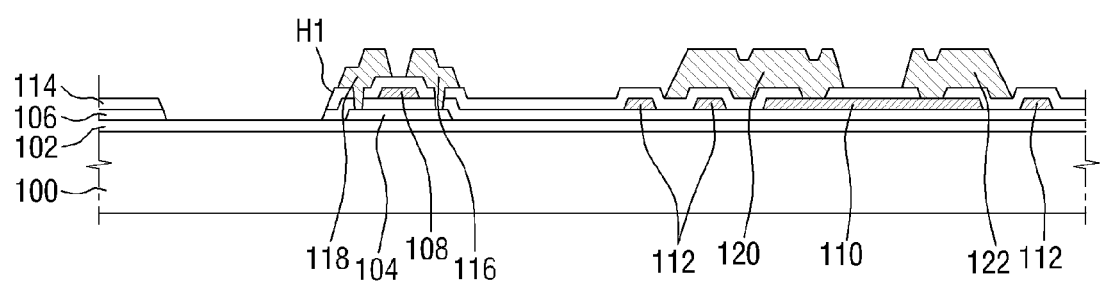

Referring to FIG. 8, a source electrode 116, a drain electrode 118, a first lower connection electrode 120, and a second lower connection electrode 122 may be formed on the interlayer insulating film 114. Here, the source electrode 116, the drain electrode 118, the first lower connection electrode 120 and the second lower connection electrode 122 may be formed simultaneously.

Referring to FIG. 9, a via layer 124 may be formed on the source electrode 116, the drain electrode 118, the first lower connection electrode 120 and the second lower connection electrode 122. Here, the via layer 124 may include a plurality of holes H6 through H10 described above. The holes H6 through H10 may be formed by a general photoresist process.

Figure 10:
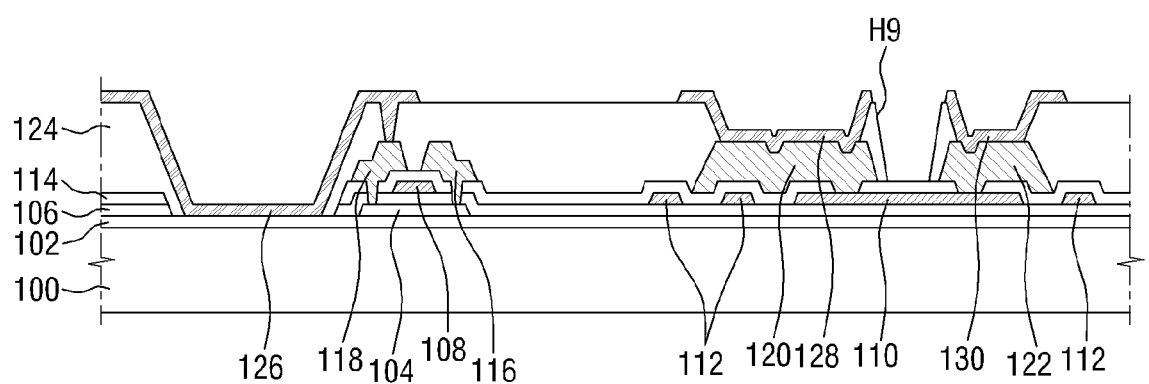

Referring to FIG. 10, a first electrode 126, a first upper connection electrode 128, and a second upper connection electrode 130 may be formed on the via layer 124, the first lower connection electrode 120, and the second lower connection electrode 122, respectively. Here, the first electrode 126, the first upper connection electrode 128, and the second upper connection electrode 130 may be formed simultaneously.

Referring to FIG. 11, a pixel defining layer 132 may be formed on the first electrode 126, the first upper connection electrode 128, and the second upper connection electrode 130. Here, the pixel defining layer 132 may include a plurality of holes H11 through H14. The holes H11 through H4 may be formed by a general photoresist process.

Figure 12:
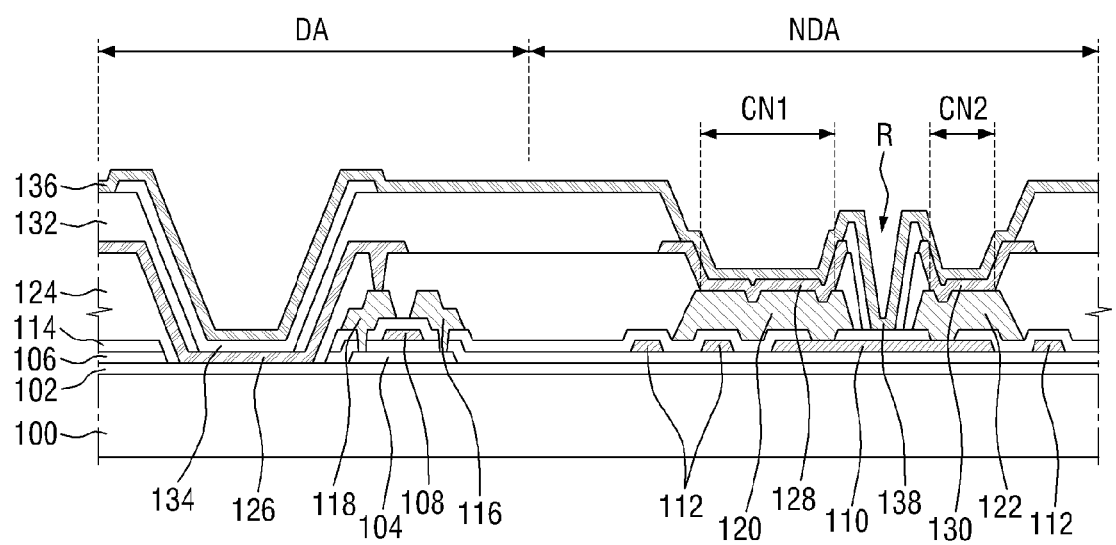

Referring to FIG. 12, an organic light-emitting layer 134 may be formed on the first electrode 126 exposed by the pixel defining layer 132. Then, a second electrode 136 and an extension electrode 138 may be formed on the organic light-emitting layer 134, the pixel defining layer 132, the first upper connection electrode 128, and the second upper connection electrode 130. Here, the second electrode 136 and the extension electrode 138 may be formed simultaneously using an open mask.

Figure 13:
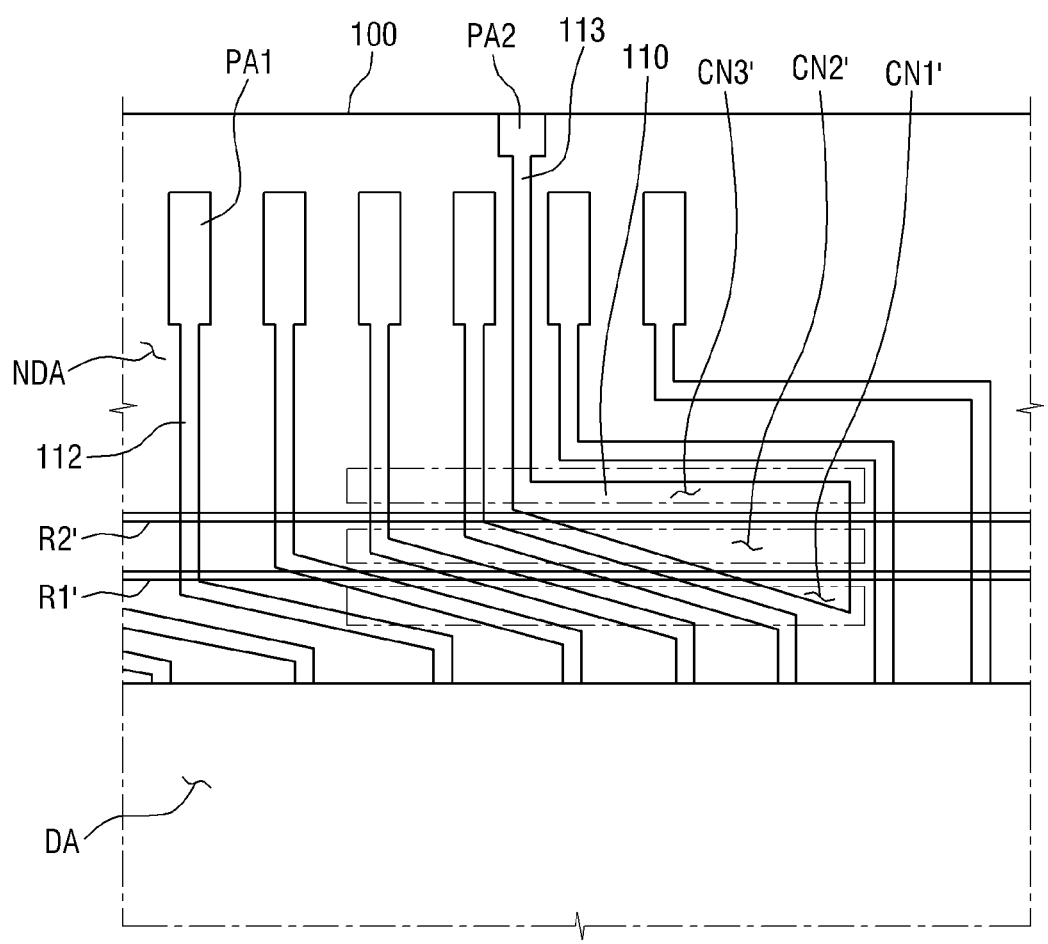
FIG. 13 is a partially enlarged plan view of an OLED according to another embodiment of the present invention.

FIG. 13 is a partial enlarged plan view of an OLED according to another embodiment of the present invention. For simplicity, elements substantially identical to those of the above-described drawings are indicated by like reference numerals, and thus a redundant description thereof will be omitted.

Referring to FIG. 13, the OLED according to the current embodiment may include two recess patterns R1' and R2'. The two recess patterns R1' and R2' may be disposed parallel to each other. In addition, the two recess patterns R1' and R2' may pass over a power supply plate 110. Accordingly, three contact regions CN1' through CN3' may be formed. That is, the contact regions CN1' through CN3' may include a first contact region CN1', a second contact region CN2', and a third contact region CN3'. However, the present invention is not limited thereto, and when the number of recess patterns is n (where n is an integer of 2 or more), the number of contact regions may be n+1.

Embodiments of the present invention provide at least one of the following advantages.

That is, it is possible to protect organic light-emitting devices, TFTs, etc. from external moisture.

In addition, it is possible to control heat generated from a panel below a certain level.

However, the effects of the present invention are not restricted to the one set forth herein. The above and other effects of the present invention will become more apparent to one of daily skill in the art to which the present invention pertains by referencing the claims.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. An organic light-emitting display (OLED), comprising:
a substrate comprising a display area and a non-display area adjacent to the display area;
an organic light-emitting device located on the display area of the substrate and comprising a first electrode, an organic light-emitting layer and a second electrode stacked sequentially;
a power supply plate located on the non-display area of the substrate; and
an extension electrode located on the non-display area of the substrate, extending from the second electrode, and electrically connected to the power supply plate,
at least one recess pattern formed on the power supply plate, the extension electrode covering the recess pattern, and an interlayer insulating film interposed between the power supply plate and a portion of the extension electrode located at a valley of the recess pattern,
the at least one recess pattern linearly extends along an edge of the display area of the substrate and surrounds the display area.

2. The OLED of claim 1, the extension electrode being formed of a same material as the second electrode.

3. The OLED of claim 1, the non-display area comprising contact regions in which the power supply plate and the extension electrode are connected to each other,
the contact regions comprising
a first contact region located on a side of the recess pattern and
a second contact region located on another side of the recess pattern.

4. The OLED of claim 3, the sum of the areas of the contact regions being greater than the area of the power supply plate.

5. The OLED of claim 1, further comprising a thin-film transistor (TFT) located on the display area of the substrate, the TFT comprising:
a semiconductor pattern located on the substrate;
a gate electrode located on the semiconductor pattern;
a source electrode located on a side of the gate electrode and connected to a side of the semiconductor pattern; and
a drain electrode located on another side of the gate electrode and connected to another side of the semiconductor pattern,
the drain electrode being connected to the first electrode, and
the power supply plate being made of a same material as the gate electrode.

6. The OLED of claim 5, further comprising lower connection electrodes interposed between the power supply plate and the extension electrode and electrically connected to the power supply plate,
the lower connection electrodes comprising
a first lower connection electrode located on a side of the recess pattern and
a second lower connection electrode located on another side of the recess pattern.

7. The OLED of claim 6, the recess pattern being formed between the first lower connection electrode and the second lower connection electrode.

8. The OLED of claim 6, the lower connection electrodes being made of a same material as the source electrode and the drain electrode.

9. The OLED of claim 6, further comprising upper connection electrodes interposed between the lower connection electrodes and the extension electrode and connected to the lower connection electrodes and the extension electrode,
the upper connection electrodes comprising
a first upper connection electrode interposed between the first lower connection electrode and the extension electrode and
a second upper connection electrode interposed between the second lower connection electrode and the extension electrode.

10. The OLED of claim 9, the upper connection electrodes being made of a same material as the first electrode.

11. The OLED of claim 9, side surfaces of the lower connection electrodes and side surfaces of the upper connection electrodes being covered with an insulating layer.

12. An organic light-emitting display (OLED), comprising:
a substrate comprising a display area and a non-display area adjacent to the display area;
an organic light-emitting device located on the display area of the substrate;
a power supply plate located on the non-display area of the substrate;
a first lower connection electrode and a second lower connection electrode located on opposite sides of the power supply plate, respectively; and
an extension electrode extending to the display area to be connected to the organic light-emitting device.

13. The OLED of claim 12, further comprising
a recess pattern being formed at a boundary between the opposite sides of the power supply plate, and
the extension electrode covering the recess pattern.

14. The OLED of claim 13, the organic light-emitting device comprising a first electrode, an organic light-emitting layer, and a second electrode stacked sequentially, and
the extension electrode being connected to the second electrode.

15. A method of manufacturing an OLED, the method comprising:
forming a power supply plate on a non-display area of a substrate;
forming a first lower connection electrode and a second lower connection electrode on opposite sides of the power supply plate, respectively;

forming a first upper connection electrode and a second upper connection electrode on the first lower connection electrode and the second lower connection electrode, respectively; and forming an extension electrode, which extends to a display area of the substrate, on the first upper connection electrode and the second upper connection electrode.

16. The method of claim 15, wherein the extension electrode covering a recess pattern formed at a boundary between the opposite sides of the power supply plate.

17. The method of claim 15, further comprising forming a TFT, which comprises a gate electrode, a source electrode and a drain electrode, on the display area of the substrate before the forming of the first upper connection electrode and the second upper connection electrode, wherein the power supply plate being formed at a same time as the gate electrode, and the first lower connection electrode and the second lower connection electrode are formed at a same time as the source electrode and the drain electrode.

18. The method of claim 15, further comprising sequentially stacking a first electrode, an organic light-emitting layer, and a second electrode on the display area of the substrate after the forming of the first lower connection electrode and the second lower connection electrode, forming the first upper connection electrode and the second upper connection electrode at a same time as the first electrode, and forming the extension electrode at a same time as the second electrode.

19. The OLED of claim 12, further comprising:

a first upper connection electrode and a second upper connection electrode which are located on the first lower connection electrode and the second lower connection electrode, respectively; and the extension electrode located on the first upper connection electrode and the second upper connection electrode.

* * * * *